United States Patent [19]

Muramatsu

[11] Patent Number: 4,678,998

[45] Date of Patent: Jul. 7, 1987

[54] BATTERY CONDITION MONITOR AND MONITORING METHOD

[75] Inventor: Kunihiro Muramatsu, Yokosuka, Japan

[73] Assignee: Nissan Motor Company, Limited, Japan

[21] Appl. No.: 806,772

[22] Filed: Dec. 9, 1985

[30] Foreign Application Priority Data

Jan. 25, 1985 [JP] Japan .................................. 60-11891

[51] Int. Cl.⁴ ........................................... G01N 27/46
[52] U.S. Cl. .................................... 324/427; 324/430; 320/48; 340/636
[58] Field of Search .......................... 320/48; 340/636; 324/57 SS, 426–431

[56] References Cited

U.S. PATENT DOCUMENTS 4,204,162  5/1980  Froidevaux ......................... 324/430
4,231,027  10/1980  Mann ................................... 324/430
4,259,639  3/1981  Renirie ................................ 324/430

FOREIGN PATENT DOCUMENTS 53-127646  8/1978  Japan .
2126735  3/1984  United Kingdom .

OTHER PUBLICATIONS

Willihnganz: "Battery Impedance"–Electrical Engineering Sep. 1959–pp. 922–925.

Primary Examiner—Reinhard J. Eisenzopf
Assistant Examiner—Jose M. Solis
Attorney, Agent, or Firm—Lowe, Price, LeBlanc, Becker & Shur

[57] ABSTRACT

A battery condition monitor and monitoring method uses known relationships between battery impedance, remaining capacity and remaining service life at different frequencies to detect remaining capacity and remaining service life. The monitor includes a computer for computing internal impedances of the storage battery from different frequency components of voltage and amperage signals from the battery, a memory for storing predetermined relationships between the internal impedance, remaining capacity and remaining service life of the storage battery for each of the frequencies and a device for determining the remaining capacity and remaining service life values for the storage battery in agreement at both or all frequency values derives from the computed internal impedances. The exact remaining capacity and service life of the storage battery are continuously monitored.

7 Claims, 5 Drawing Figures

BATTERY CONDITION MONITOR AND MONITORING METHOD

BACKGROUND OF THE INVENTION

1. Field of the Invention

This invention relates to a battery condition monitor and monitoring method by which the remaining capacity and service life of an storage battery, e.g. an automotive vehicle storage battery, can be monitored.

2. Description of the Prior Art

The primary function of an automotive vehicle storage battery is to supply current to a starter motor and an ignition system when an engine is being started. It also supplies current for lights, radio, and other electrical accessories when an alternator is not handling the electrical demand. A battery condition monitor serves to back the storage battery up and perform its essential function when the remaining capacity and service life of the storage battery drop below acceptable levels.

Japanese published unexamined patent application No. 53-127646 discloses a prior art battery condition monitor which measures the remaining capacity of the storage battery by means of the supported rate between the internal impedance and the remaining capacity of the storage battery.

However, since this rate depends on the remaining service life of the storage battery, the prior art battery condition monitor cannot measure the remaining capacity of the storage battery accurately.

SUMMARY OF THE INVENTION

An object of this invention is to provide a battery condition monitor for a storage battery capable of accurately measuring both remaining capacity and service life. In order to achieve this object, this invention comprises means for computing the internal impedances of the storage battery at various frequencies from the voltage and amperage of battery output at each frequency, means for storing a predetermined relationship between the internal impedance, remaining capacity and remaining service life of the storage battery for each of the frequency components and means for looking up the remaining capacity and remaining service life of the storage battery in accordance with the computed internal impedances at each frequency. According to this invention, the exact remaining capacity and remaining service life of the storage battery is continuously monitored, so that maintenance of the storage battery is facilitated.

DESCRIPTION OF THE PREFERRED EMBODIMENTS

The preferred embodiments of this invention will be described with reference to FIGS. 1 to 5.

Figure 1:
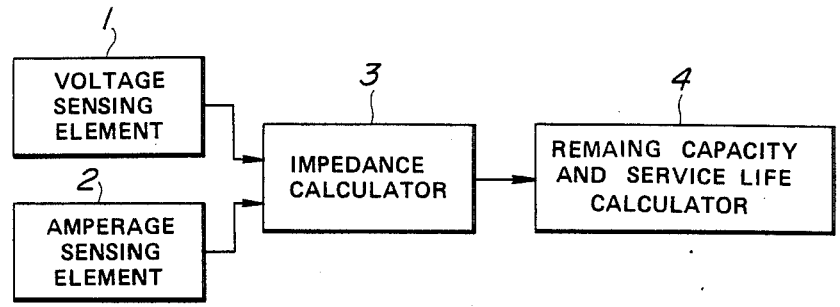
FIG. 1 is a block diagram showing the principles of a battery condition monitor according to this invention.

As shown in FIG. 1, the battery condition monitor of this invention comprises a voltage sensing element 1, an amperage sensing element 2, an impedance calculator 3, and a remaining capacity and remaining service life calculator 4. "Remaining service life" of a storage battery in question is used relative to full service life of a new storage battery.

The voltage sensing element 1 continuously monitors the voltage across the terminals of the storage battery in question. The amperage sensing element 2 continuously monitors the current flowing into and out of the storage battery. The impedance calculator 3 calculates the internal impedances of the storage battery at different frequency levels from the voltage and amperage values sensed by the respective voltage sensing element 1 and amperage sensing element 2. The remaining capacity and remaining service life calculator 4 calculates the remaining capacity and remaining service life of the storage battery from its internal impedances at different frequencies and empirically determined relationships between the internal impedances and the remaining capacity and remaining service life of the storage battery.

Figure 2:
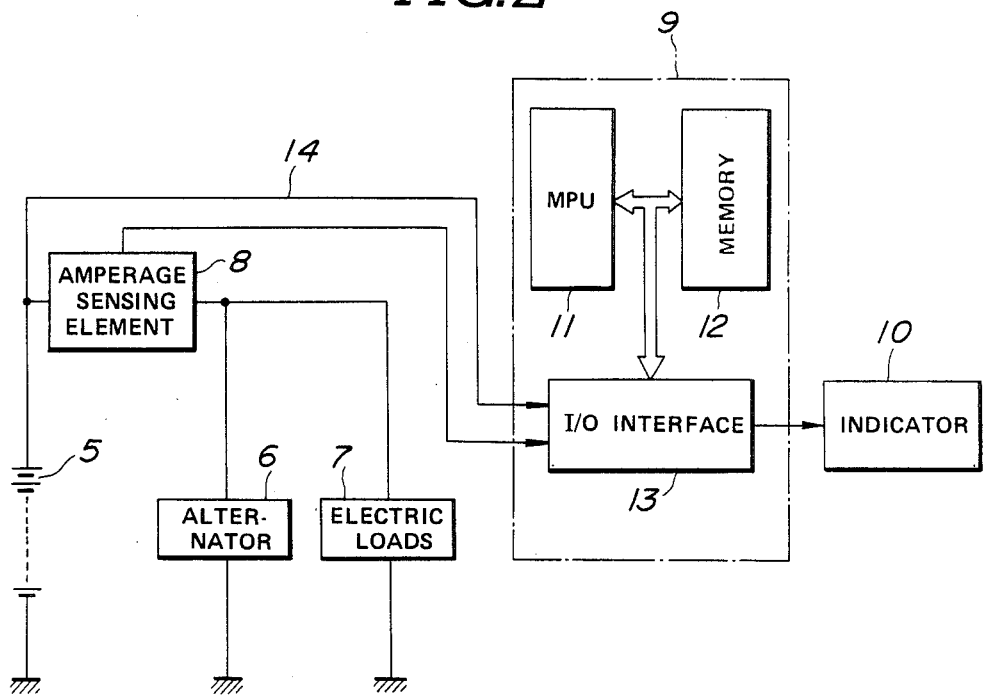
FIG. 2 is a block diagram of a battery condition monitor according to a preferred embodiment of this invention.

As shown in FIG. 2, a storage battery 5 installed within an automotive vehicle is connected in parallel to a generator or an alternator 6 and a group of electrical loads 7 which includes a starter motor, an ignition system and other electrical accessories, e.g. lights, a radio and an air conditioner. The alternator 6 has a rectifier (not shown) and supplies rectified current to both the group of electrical loads 7 and the storage battery 5. Changes or variations in this rectified current effect the current flowing into and out of the storage battery 5. The operational modes of the alternator 6 and each electrical load in the group 7 produce different frequency components in the currents to and from the storage battery 5.

The battery condition monitor according to an embodiment of this invention comprises an amperage sensor 8, a microcomputer 9 and an indicator 10, e.g. a liquid crystal display. The microcomputer 9 includes a microprocessor unit or MPU 11, a memory 12 which includes ROM and RAM, and an input/output interface or I/O interface 13 which includes a wave-forming circuit, an analog/digital or A/D converter and a digital/analog or D/A converter.

A signal representing the terminal voltage V(t) of the storage battery 5 is sent to the I/O interface 13 via a line 14 working as a voltage sensing element. The I/O interface 13 sends a corresponding terminal voltage signal to the MPU 11 via its A/D converter.

The input terminals of the amperage sensor 8 are connected to the storage battery 5 and the alternator 6. The output terminal of the amperage sensor 8 is connected to the I/O interface 13. The amperage sensor 8 sends a signal representing the current amperage I(t), e.g., 10 amps. to or from the storage battery 5 to the I/O interface 13. The I/O interface 13 sends a corresponding current amperage signal to the MPU 11 via its A/D converter.

The MPU 11 computes internal impedances, e.g. $R_{f1}$ and $R_{f2}$ of the storage battery 5 at different frequencies f1 and f2 from the sensed terminal voltage V(t) and the sensed current amperage I(t).

Figure 4:
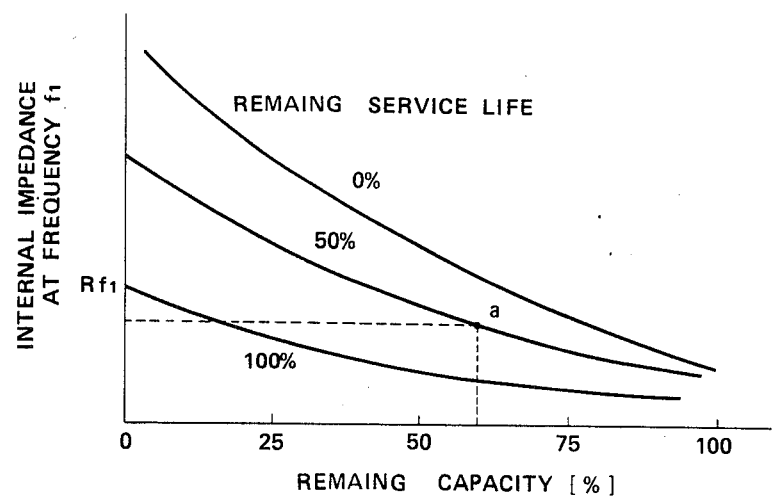
FIG. 4 is a graph of the relationship between the internal impedance and the remaining capacity and service life of the storage battery at frequency f1.
Figure 5:
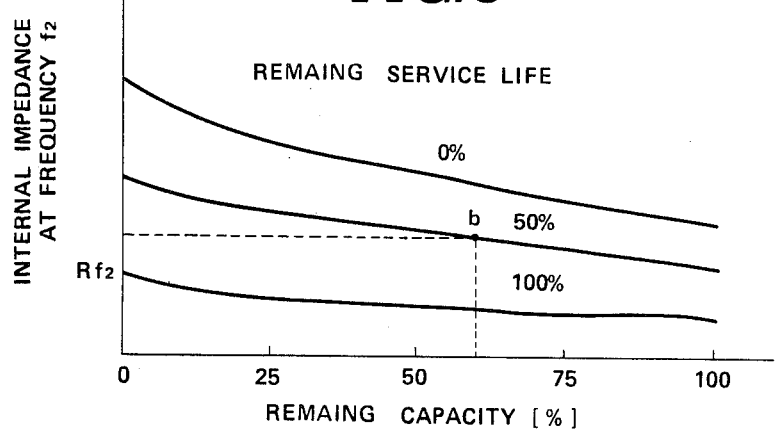
FIG. 5 is a graph similar to FIG. 4 but at frequency f2.

The memory 12 stores predetermined functions representing the relationships between the internal impedance and the remaining capacity and remaining service life of the storage battery 5 at different frequencies f1 and f2. FIG. 4 shows three curves at the 0-, 50- and 100-percent remaining service life values corresponding to the above functions at the frequency f1. FIG. 5 shows three curves at the 0-, 50- and 100-percent remaining service life values corresponding to the above functions at frequency f2.

It is apparent from FIGS. 4 and 5 that the internal impedance of the storage battery 5 increases as the remaining capacity or remaining service life of the storage battery 5 decreases.

The above curves in FIGS. 4 and 5 were obtained by plotting measured internal impedances for each value of the remaining capacity of the storage battery 5 at various levels of the remaining service life of the storage battery 5. Conditions of the above measurements are as follows:

(1) The kind of the storage battery is an automotive lead-acid battery (12 V),
(2) The temperature is about 20° C., and
(3) A method of measuring is one of JASO D101-77, JIS D5301-1973, and SAE J539i and J240a.

The MPU 11 computes the remaining capacity and remaining service life of the storage battery 5 from the internal impedances $R_{f1}$ and $R_{f2}$ and the functions shown in FIGS. 4 and 5. The indicator 10 then displays the computed remaining capacity and remaining service life of the storage battery 5.

Figure 3:
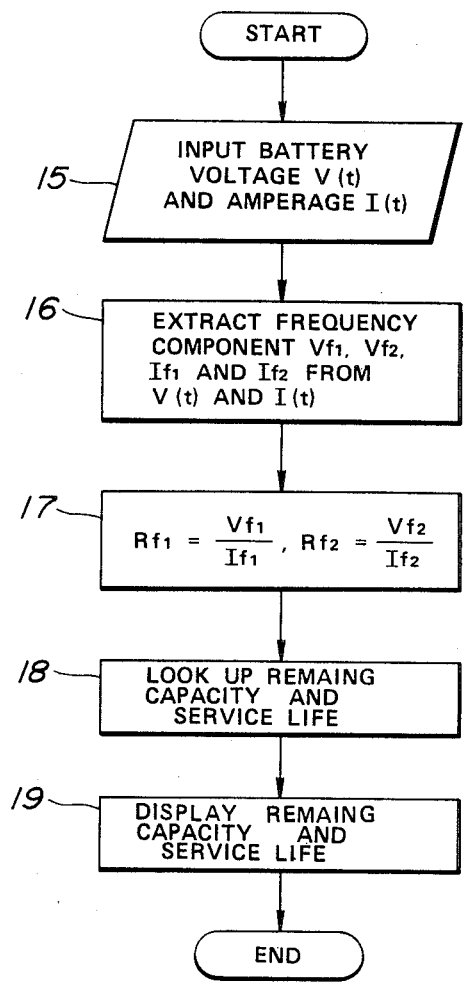
FIG. 3 is a flowchart for the battery condition monitor of FIG. 2.

The operation of the inventive battery condition monitor will be described with reference to the flowchart of FIG. 3.

At a first step 15, the MPU 11 receives signals representing the respective terminal voltage V(t) and the current amperage I(t), e.g, 10 amps. into or out of the storage battery 5. At a subsequent step 16, the MPU 11 extracts frequency components, i.e. voltages $V_{f1}$ and $V_{f2}$ and amperages $I_{f1}$ and $I_{f2}$ at frequencies f1 and f2, from the time-dependent terminal voltage V(t) and current amperage I(t) signals. At a step 17 following the step 16, the MPU 11 computes the internal impedances $R_{f1}$ and $R_{f2}$ at the respective frequencies f1 and f2 according to the following equations:

$$R_{f1} = V_{f1}/I_{f1},$$

$$R_{f2} = V_{f2}/I_{f2}.$$

At a step 18 following the step 17, the MPU 11 looks up the remaining capacity and remaining service life of the storage batter 5 from the functions shown in FIGS. 4 and 5.

The method of looking up the remaining capacity and remaining service life of the storage battery 5 at the step 18 will be described with reference to FIGS. 4 and 5. The MPU 11, using the internal impedances $R_{f1}$ and $R_{f2}$ obtained at the frequency levels f1 and f2, finds the point at which the remaining capacity values of the storage battery 5 at the impedance $R_{f1}$ and at the impedance $R_{f2}$ are in agreement and at which the remaining service life of the storage battery 5 at the internal impedance $R_{f1}$ and at the internal impedance $R_{f2}$ are in agreement. In this cae, the MPU 11 searches for the point a at the level of the internal impedance $R_{f1}$ as shown in FIG. 4 and the point b at the level of the internal impedance $R_{f2}$ as shown in FIG. 5. Both of the points a and b indicate that the remaining capacity of the storage battery 5 is 60% and that 50% of its service life remains.

At a step 19 following the step 18, the indicator 10 displays a 60% value for the remaining capacity of the storage battery 5 and a 50% remaining service life value.

In another embodiment, temperature compensation for the internal impedance, which would provide more exact values for the remaining capacity and remaining service life of the storage battery 5, could be performed by detecting the temperature of the storage battery 5.

What is claimed is:

1. A battery condition monitor for a storage battery into and out of which currents flow, said currents having components of different frequencies, comprising:
    means for detecting a terminal voltage of the storage battery;
    first means for extracting voltage frequency components from the detected terminal voltage;
    means for detecting an amperage of the currents;
    second means for extracting amperage frequency components at the same frequencies as said voltage frequency components from the detected amperage;
    means for computing internal impedances of the storage battery at each of said frequencies from the voltage and amperage frequency components;
    means for storing predetermined relationships between the internal impedance, remaining capacity and remaining service life of the storage battery for each of said frequencies; and
    means for determining the remaining capacity and remaining service life values of the storage battery at said frequencies from the computed internal impedances and said predetermined relationships.

2. A battery condition monitor for a storage battery in an automotive vehicle connected to an alternator, the storage battery receiving and supplying currents having components of different frequencies, comprising:
    means for detecting a terminal voltage of the storage battery;
    first means for extracting voltage frequency components from the detected terminal voltage;
    means for detecting an amperage of the currents, one input of said amperage detecting means being connected to a terminal of the storage battery and another input of said amperage detecting means being connected to an output terminal of the alternator;
    second means for extracting amperage frequency components at the same frequencies as said voltage frequency components from the detected amperage;
    means for computing internal impedances of the storage battery at each of said frequencies from the voltage and amperage frequency components;
    means for storing predetermined relationships between the internal impedance, remaining capacity and remaining service life of the storage battery for each of said frequencies; and
    means for determining the remaining capacity and remaining service life values of the storage battery at said frequencies from the computed internal impedances and said predetermined relationships.

3. A battery condition monitor as recited in claim 2, wherein said voltage detecting means comprises a line connected to an input terminal of an input/output interface of a microcomputer including an analog/digital converter and connected to a terminal of the storage battery and wherein an output terminal of said amperage detecting means is connected to the input/output interface.

4. A method for monitoring the condition of a storage battery into and out of which currents flow, said currents having components of different frequencies, comprising the steps of:
   detecting a terminal voltage of the storage battery;
   detecting an amperage of the currents;
   extractng frequency components the detected terminal voltage and amperage signals at predetermined frequencies;
   computing internal impedances of the storage battery at said predetermined frequencies from the voltage and amperage frequency components; and
   determining the remaining capacity and remaining service life of the storage battery at said predetermined frequencies derived from the computed internal impedances, said determining step being carried out in accordance with predetermined relationships between the internal impedance, remaining capacity and remaining service life of the storage battery for each of said frequencies.

5. A battery condition monitor as recited in claim 1, wherein said predetermined relationships comprise functions formed by plotted measured internal impedances of the storage battery for each value of the remaining capacity of the storage battery at various levels of the remaining service life of the storage battery.

6. A battery condition monitor as recited in claim 5, wherein said determining means comprises a microprocessor means, said microprocessor means operable for looking up in accordance with said functions a point at which remaining capacities of the storage battery at a first internal impedance of the storage battery, computed at a first frequency, and at a second internal impedance of the storage battery, computed at a second frequency, are in agreement and at which remaining service lives of the storage battery at the first and second internal impedances of the storage battery are in agreement.

7. A method for monitoring the condition of a battery as recited in claim 4, wherein said predetermined relationships comprise functions formed by plotted measured internal impedances of the storage battery for each value of the remaining capacity of the storage battery at various levels of the remaining service life of the storage battery.

* * * * *